United States Patent
Hsiang et al.

(10) Patent No.: US 10,362,651 B2
(45) Date of Patent: Jul. 23, 2019

(54) MICRO LIGHTING DEVICE

(71) Applicant: ACER INCORPORATED, New Taipei (TW)

(72) Inventors: Jui-Chieh Hsiang, New Taipei (TW); Chih-Chiang Chen, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 0 days.

(21) Appl. No.: 15/922,884

(22) Filed: Mar. 15, 2018

(65) Prior Publication Data

US 2019/0174595 A1 Jun. 6, 2019

(30) Foreign Application Priority Data

Dec. 5, 2017 (TW) .............................. 106142493 A

(51) Int. Cl.
  *H01L 27/15* (2006.01)
  *H01L 33/62* (2010.01)
  *H05B 33/08* (2006.01)

(52) U.S. Cl.
  CPC ....... *H05B 33/0851* (2013.01); *H01L 27/156* (2013.01); *H01L 33/62* (2013.01); *H05B 33/0815* (2013.01)

(58) Field of Classification Search
  CPC ......... G09G 3/3648; G09G 2300/0408; G09G 2300/08; G09G 2320/043; G09G 2300/043; G09G 2310/0248; G09G 2310/0267
  USPC ........ 345/92, 102, 204, 211, 82, 87, 98, 212
  See application file for complete search history.

(56) References Cited

U.S. PATENT DOCUMENTS

| | | | | |
|---|---|---|---|---|
| 2002/0167474 A1* | 11/2002 | Everitt | ................. | G09G 3/3216 345/82 |
| 2004/0080472 A1* | 4/2004 | Miyakawa | ........... | G09G 3/3216 345/76 |
| 2007/0046611 A1* | 3/2007 | Routley | ............... | G09G 3/3216 345/98 |
| 2007/0210995 A1* | 9/2007 | Ogura | .................. | G09G 3/3283 345/76 |
| 2015/0348504 A1* | 12/2015 | Sakariya | .............. | G09G 3/3233 345/206 |
| 2017/0301659 A1* | 10/2017 | Liao | ....................... | H01L 25/167 |
| 2018/0047325 A1* | 2/2018 | Biwa | .................... | G09G 3/2003 |

FOREIGN PATENT DOCUMENTS

| | | |
|---|---|---|
| CN | 201844245 U | 5/2011 |
| TW | 200919426 | 5/2009 |
| TW | I596411 B | 8/2017 |
| TW | I604752 B | 11/2017 |

* cited by examiner

*Primary Examiner* — Wei (Victor) Chan
(74) *Attorney, Agent, or Firm* — Winston Hsu

(57) ABSTRACT

A micro lighting device includes a source line, a drain line, a ground line, an illuminating device, and a switching device. The illuminating device includes a first electrode and a second electrode coupled to the ground line. The switching device includes a first end coupled to the drain line, a second end coupled to the first electrode via the source line, and a control end coupled to the gate line. At least one of the source line, the drain line, the gate line and the ground line includes an adjustable impedance structure for adjusting the current flowing through the illuminating device.

9 Claims, 13 Drawing Sheets

MICRO LIGHTING DEVICE

CROSS REFERENCE TO RELATED APPLICATION

This application claims priority of Taiwan Application No. 106142493 filed on 2017 Dec. 5.

BACKGROUND OF THE INVENTION

1. Field of the Invention

The present invention is related to a micro lighting device, and more particularly, to a micro lighting device with demura mechanism.

2. Description of the Prior Art

Compared to traditional incandescent bulbs, light-emitting diodes (LEDs) are advantageous in low power consumption, long lifetime, small size, no warm-up time, fast reaction speed, and the ability to be manufactured as small or array devices. In addition to outdoor displays, traffic signs, and liquid crystal display (LCD) backlight for various electronic devices such as mobile phones, notebook computers or personal digital assistants (PDAs), LEDs are also widely used as indoor/outdoor lighting devices in place of fluorescent of incandescent lamps.

The size of traditional LED arrays is the dimension of millimeters (mm). The size of micro LED arrays may be reduced to the dimension of micrometers (μm) while inheriting the same good performances regarding power consumption, brightness, resolution, color saturation, reaction speed, life time and efficiency. In a micro LED manufacturing process, a thin-film, miniaturized and array design is adopted so that multiple micro LEDs are fabricated in the dimension of merely 1-500 μm. Next, these micro LEDs are mass transferred to be disposed on another circuit board. Protection layers and upper electrodes may be formed in a physical deposition process before packaging the upper substrate.

Mura is a typical defect of display panel, appearing as local lightness variation with low contrast and blurry contour, more noticeable when displaying black images or low grey scale images. LED devices with severe mura issue are normally downgraded as sub-quality products with lower prices.

SUMMARY OF THE INVENTION

The present invention provides a micro lighting device including a source line, a drain line, a gate line, a ground line, a luminescent device and a switching device. The luminescent device includes a first electrode and a second electrode coupled to the ground line. The switching device includes a first end coupled to the source line, a second end coupled to the first electrode via the drain line, and a control end coupled to the gate line. At least one of the source line, the drain line, the gate line and the ground line includes an adjustable impedance structure for adjusting current flowing through the illuminating device.

The present invention also provides a micro lighting device including a plurality of wafers, a controller, and a plurality of transmission lines. A plurality of luminescent devices are disposed on the plurality of wafers. The controller is configured to provide a driving signal for operating the plurality of luminescent devices. The plurality of transmission lines are arranged to couple the plurality of wafers to the controller for receiving the control signal, wherein at least one of the plurality of transmission lines includes an adjustable impedance structure for adjusting a value of the control signal.

The present invention also provides a micro lighting device including a plurality of wafers, a controller, and a plurality of transmission lines. A plurality of luminescent devices are disposed on the plurality of wafers. The controller configured to provide driving signals for operating the plurality of luminescent devices and detect a brightness of each wafer and adjust a value of a corresponding driving signal for operating the plurality of luminescent devices of each wafer. The plurality of transmission lines are arranged to couple the plurality of wafers to the controller for receiving the corresponding control signals.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1A-4A are top-view diagrams illustrating micro lighting devices according to embodiments of the present invention.

FIGS. 1B-4B are equivalent circuit diagrams of micro lighting devices in operation according to embodiments of the present invention.

DETAILED DESCRIPTION

FIGS. 1A-4A are top-view diagrams illustrating micro lighting devices 100, 200, 300 and 400 according to embodiments of the present invention. The micro lighting devices 100, 200, 300 and 400 with a thin-film, miniaturized and array design each include a plurality of main luminescent devices (only one main luminescent device 10 is depicted for illustrative purpose), a redundant luminescent device 20, a plurality of switching devices (only one switching device TFT is depicted for illustrative purpose), a drain line 30, a gate line 40, a source line 50, and a ground line 60.

Figure 7:
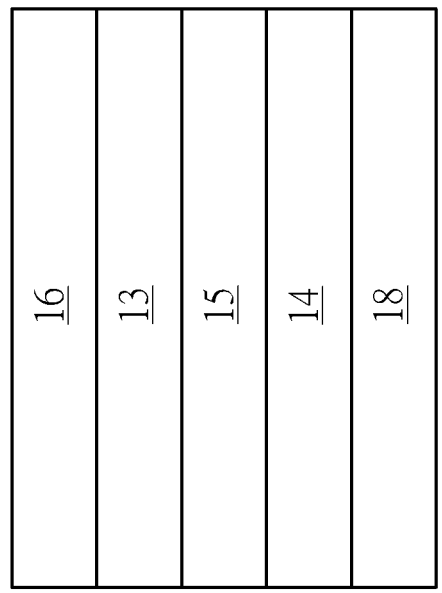
FIG. 7 is structural diagram illustrating a luminescent device according to an embodiment of the present invention.

The main luminescent device 10 and the redundant luminescent device 20 are fabricated by combining P-type and N-type semiconductor materials before being mass transferred to be disposed on a substrate 90. FIG. 7 is structural diagram illustrating a luminescent device according to an embodiment of the present invention. The main luminescent device 10 may include a P-type semiconductor layer 13, an N-type semiconductor layer 14, a luminescent layer 15, a P-electrode 16, and an N-electrode 18, wherein the P-electrode 16 is electrically connected to the drain line 30 and the N-electrode 18 is electrically connected to the ground line 60. Under normal condition, when a positive voltage is applied to the P-electrode 16 and a negative voltage is applied to the N-electrode 18, electrons flow from the N-region towards the P-region and holes flow from the P-region towards the N-region due to the forward-bias voltage. These electrons and holes then combine in the PN junction of the luminescent layer 15, thereby emitting photons of light.

The switching device TFT is a three-terminal device which may be disposed above or under the main luminescent device 10. The switching device TFT includes a first end coupled to the gate line 40, a second end coupled to the P-electrode 16 of the main luminescent device 10 via the drain line 30, and a control end coupled to the source line 50. The switching device 50 is configured to selectively conduct the signal transmission path between its first end and its second end according to the voltage level of its control end.

FIGS. 1B-4B are equivalent circuit diagrams of the micro lighting devices 100, 200, 300 and 400 in operation according to embodiments of the present invention. When in operation, the first end of the switching device TFT is coupled to a data line DL via the drain line 30, the control end of the switching device TFT is coupled to a scan line SL via the source line 50, and the N-electrode 18 of the main luminescent device 10 is coupled to a ground level GND via the ground line 60. By applying scan signals via the scan line SL, the switching devices TFT coupled to the scan line SL are sequentially turned on, thereby allowing data to be written into the corresponding main luminescent device 10 via the data line DL.

In an embodiment of the present invention, the main luminescent device 10 is a micro LED, a current-driven device whose brightness is proportional to the value of the driving current.

Figure 1A:
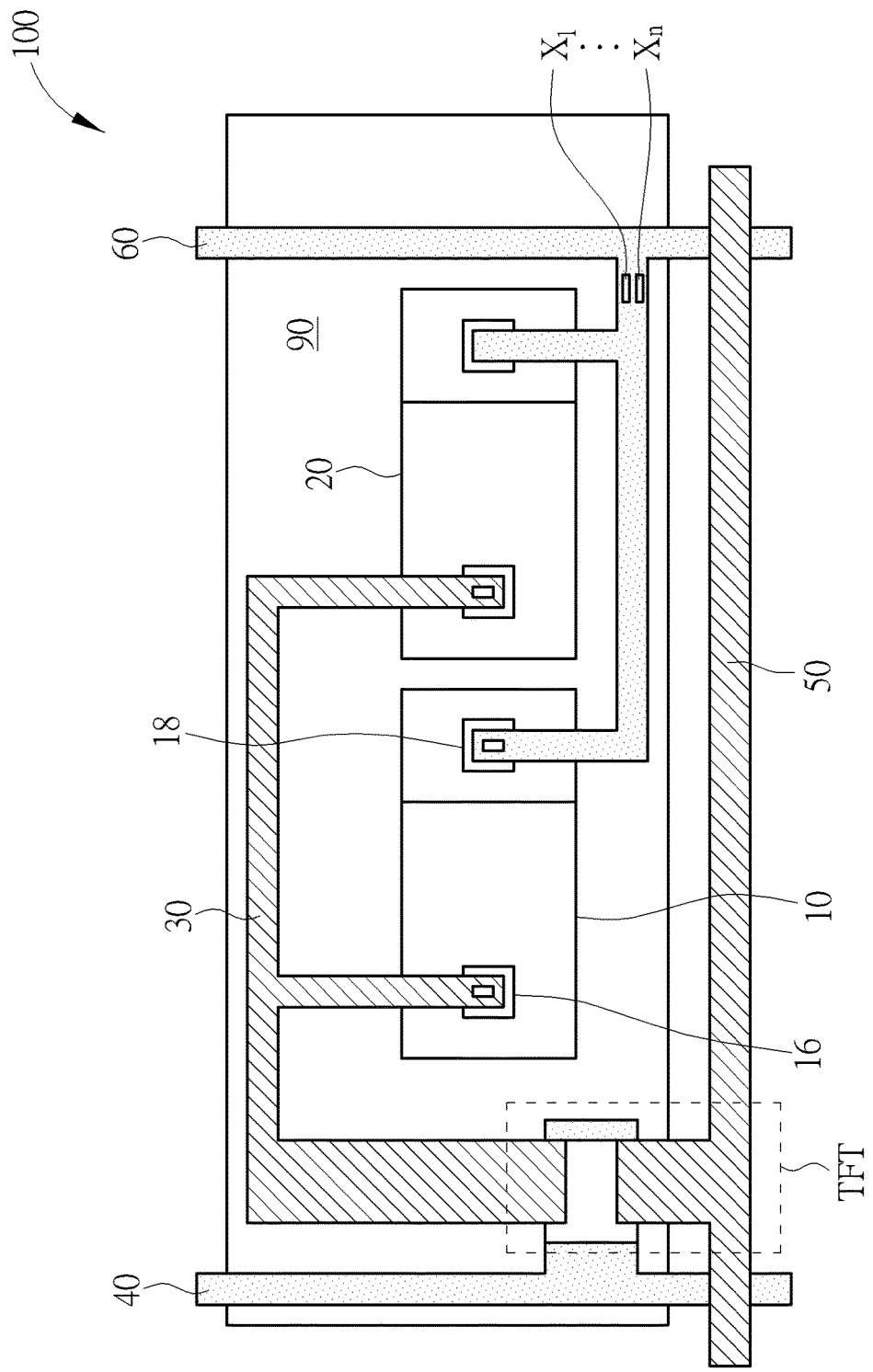
Figure 1B:
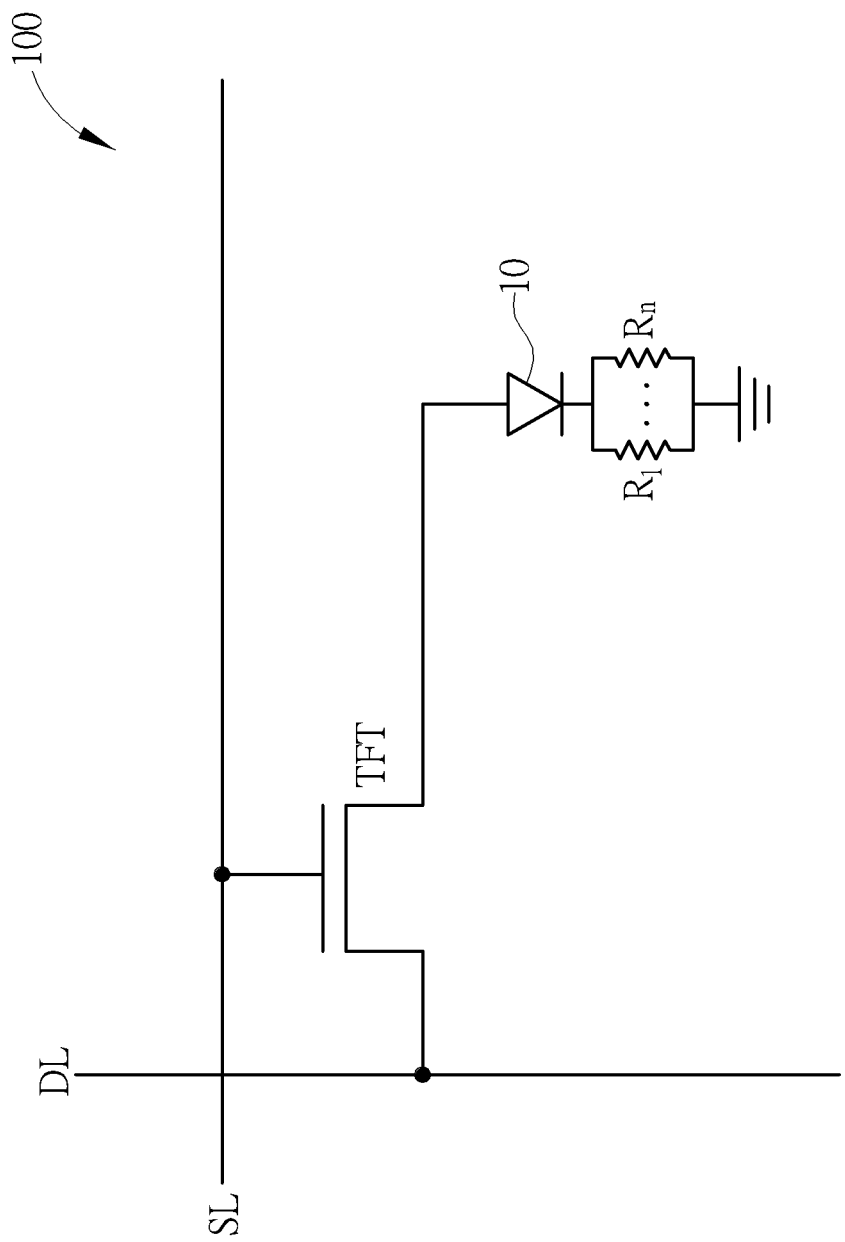

In the micro lighting device 100, pervious regions X1~Xn (n is a positive integer) may be formed on the ground line 60 using laser cutting technique, as depicted in FIG. 1A. The corresponding equivalent resistors R1~Rn associated with the pervious regions X1~Xn are depicted in FIG. 1B. Since the driving current of the main luminescent device 10 encounters an impedance whose value is influenced by the equivalent resistors R1~Rn, the brightness of the main luminescent device 10 may be adjusted by varying the value of the driving current. The areas of the pervious regions X1~Xn are associated with the values of the equivalent resistors R1~Rn, and the amount of the pervious regions X1~Xn affects the overall brightness adjustment. With the above-mentioned adjustable impedance structure included in the ground line 60, the present micro lighting device 100 is able to improve the undesirable mura effect.

Figure 2A:
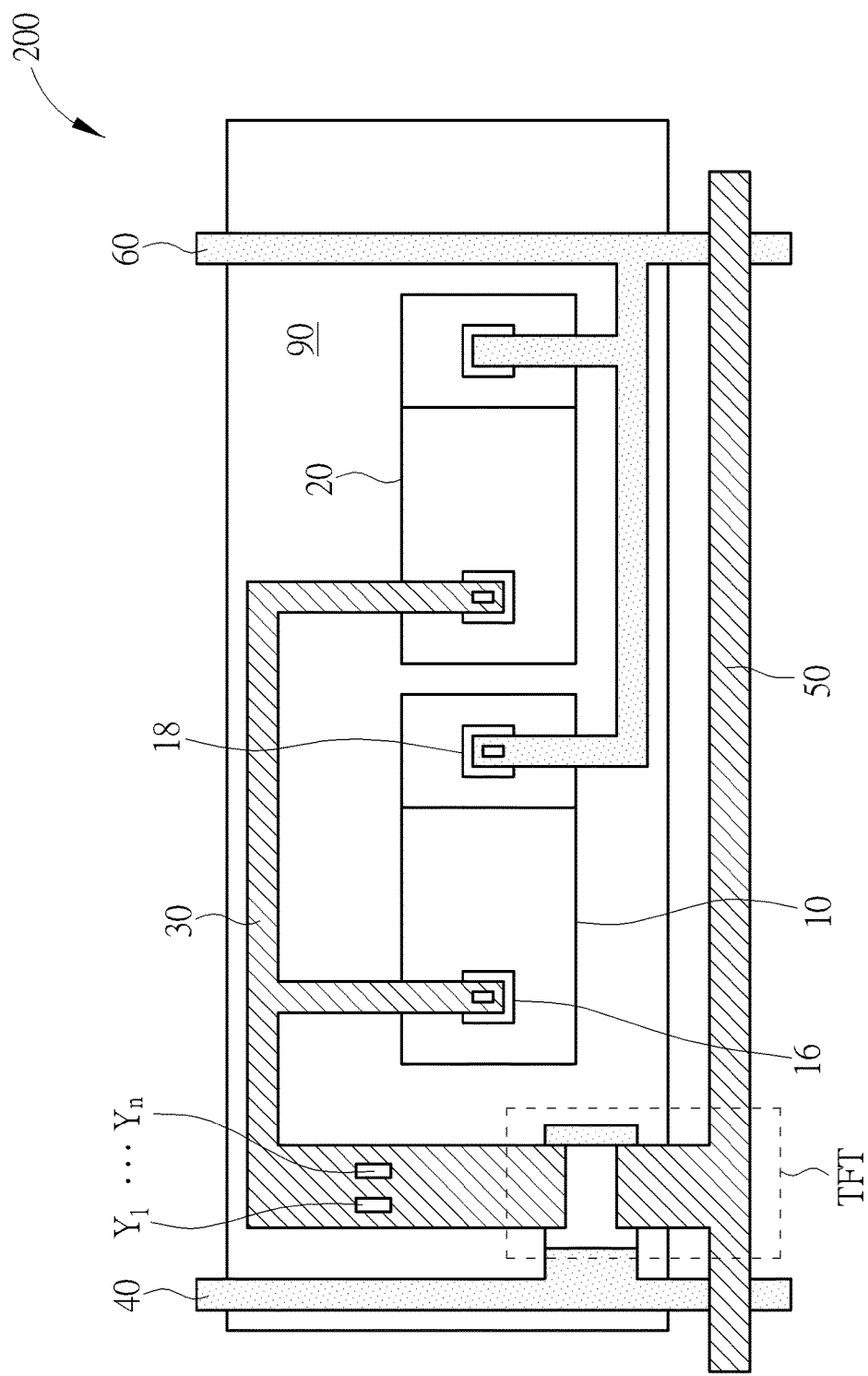
Figure 2B:
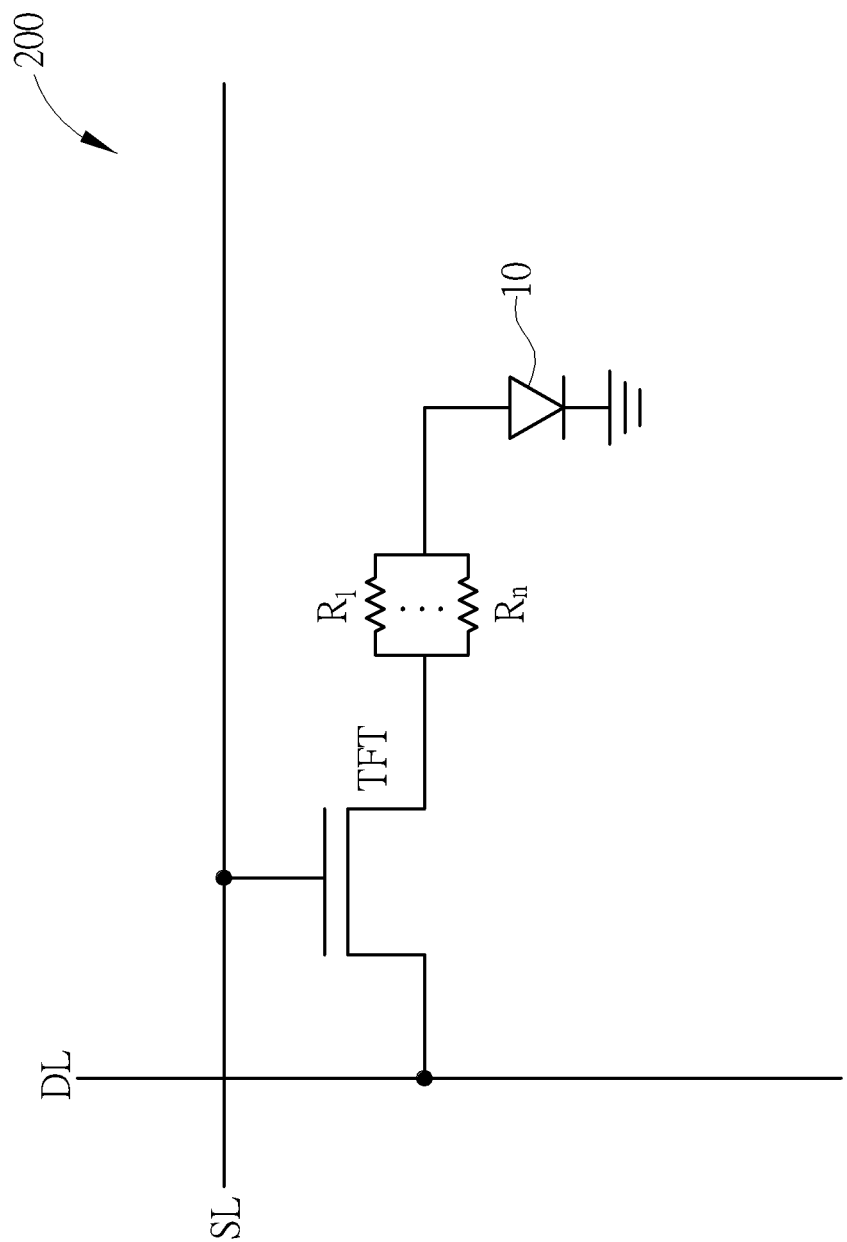

In the micro lighting device 200, pervious regions Y1~Yn (n is a positive integer) may be formed on the drain line 30 using laser cutting technique, as depicted in FIG. 2A. The corresponding equivalent resistors R1~Rn associated with the pervious regions Y1~Yn are depicted in FIG. 2B. Since the driving current of the main luminescent device 10 encounters an impedance whose value is influenced by the equivalent resistors R1~Rn, the brightness of the main luminescent device 10 may be adjusted by varying the value of the driving current. The areas of the pervious regions Y1~Yn are associated with the values of the equivalent resistors R1~Rn, and the amount of the pervious regions Y1~Yn affects the overall brightness adjustment. With the above-mentioned adjustable impedance structure included in the drain line 30, the present micro lighting device 200 is able to improve the undesirable mura effect.

Figure 3A:
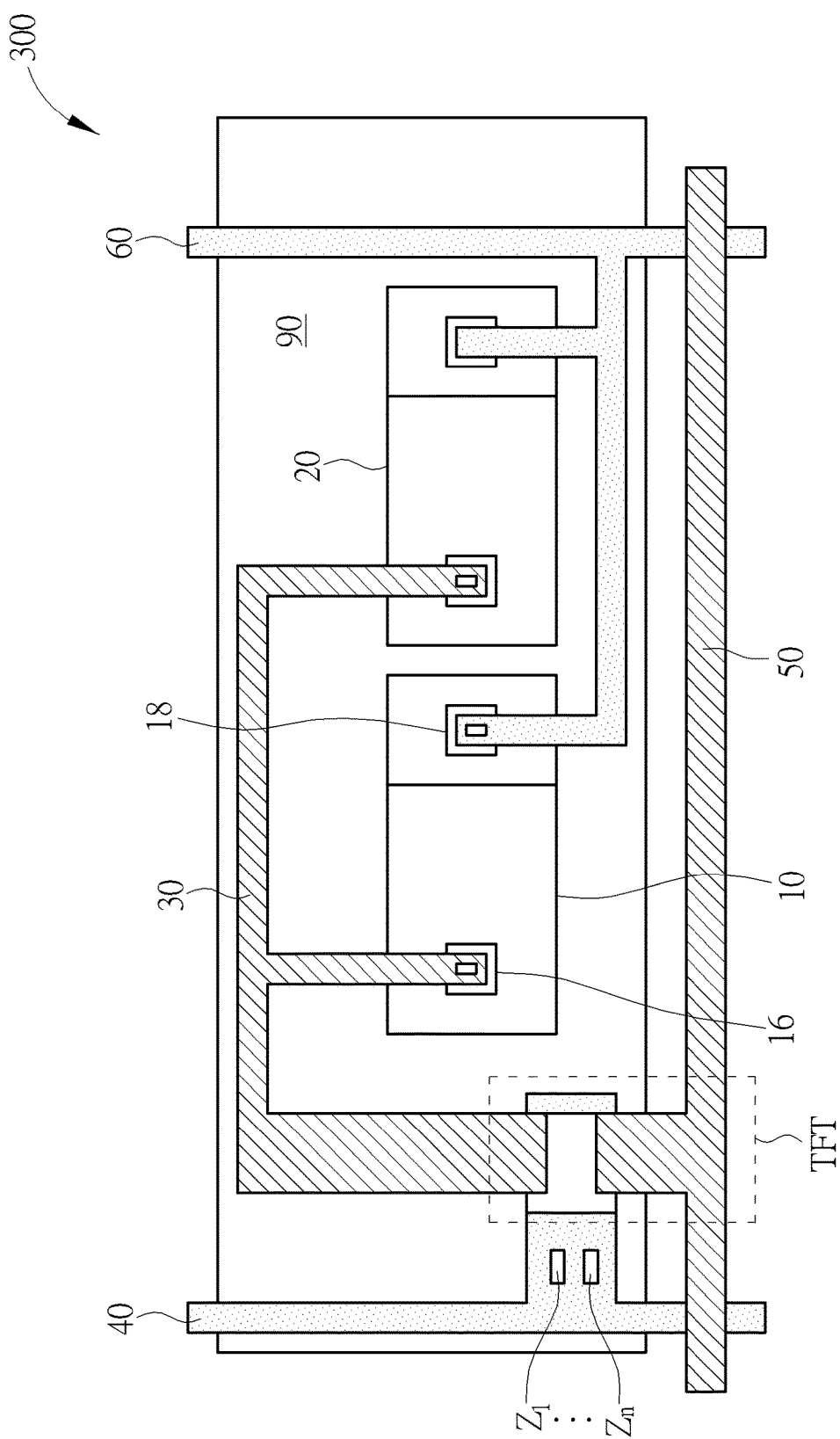
Figure 3B:
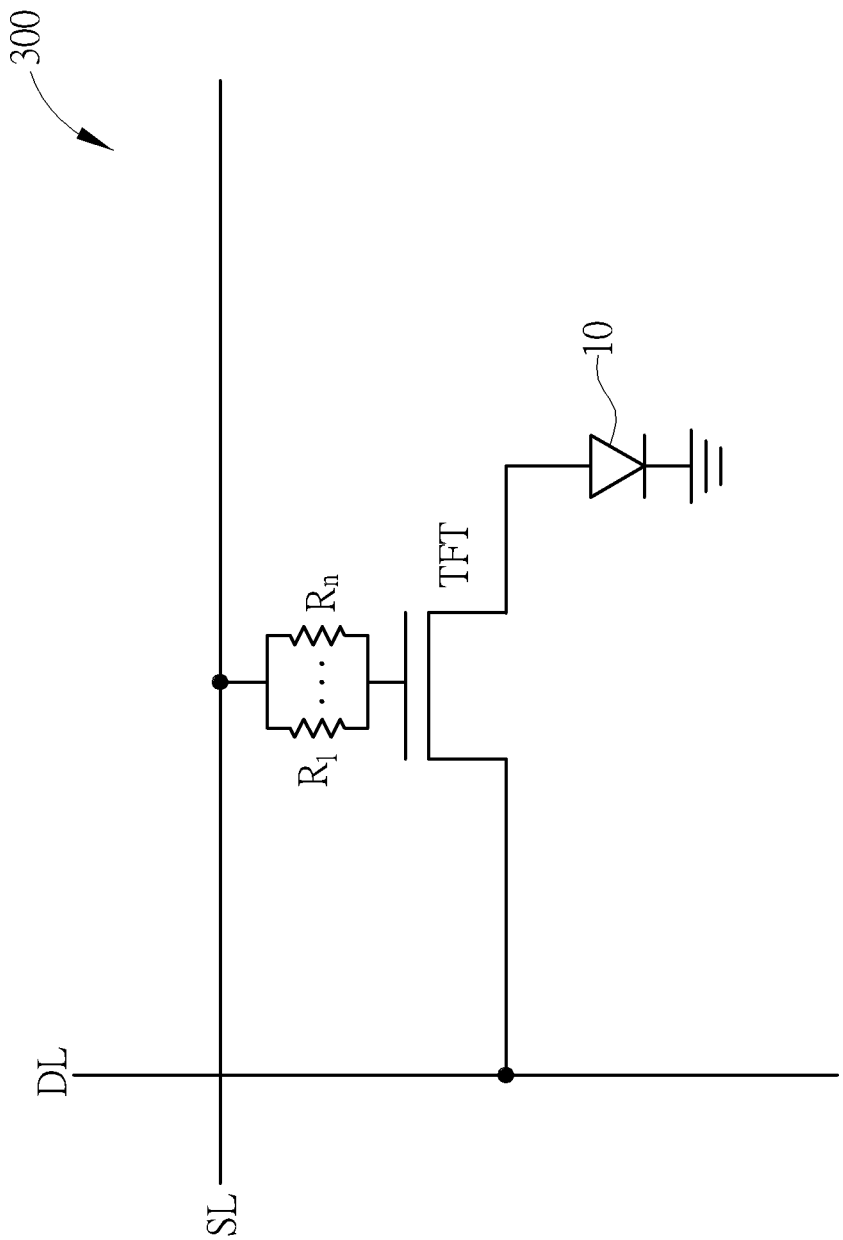

In the micro lighting device 300, pervious regions Z1~Zn (n is a positive integer) may be formed on the gate line 40 using laser cutting technique, as depicted in FIG. 3A. The corresponding equivalent resistors R1~Rn associated with the pervious regions Z1~Zn are depicted in FIG. 3B. Since the driving current of the main luminescent device 10 encounters an impedance whose value is influenced by the equivalent resistors R1~Rn, the brightness of the main luminescent device 10 may be adjusted by varying the value of the driving current. The areas of the pervious regions Z1~Zn are associated with the values of the equivalent resistors R1~Rn, and the amount of the pervious regions Z1~Zn affects the overall brightness adjustment. With the above-mentioned adjustable impedance structure included in the gate line 40, the present micro lighting device 300 is able to improve the undesirable mura effect.

Figure 4A:
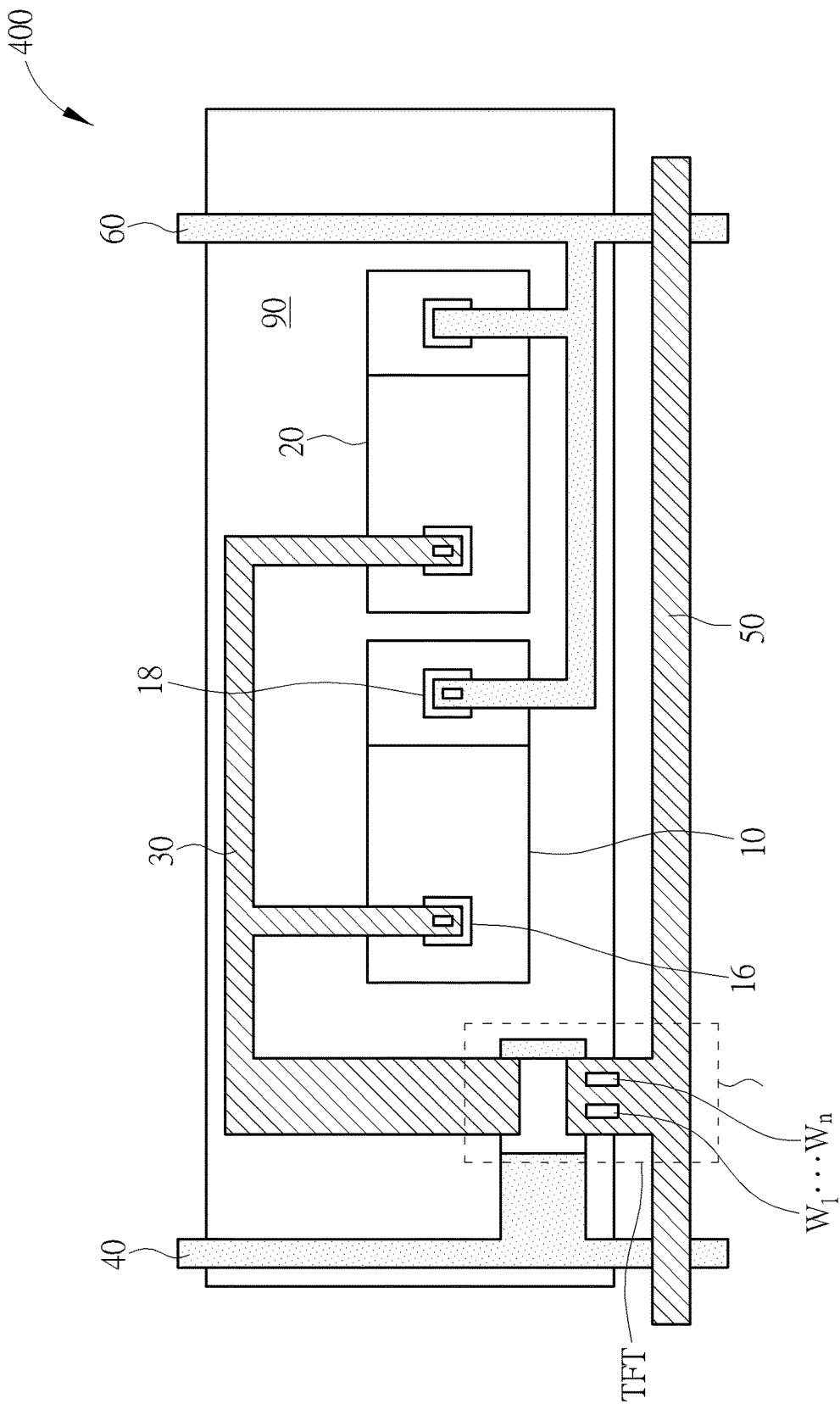
Figure 4B:
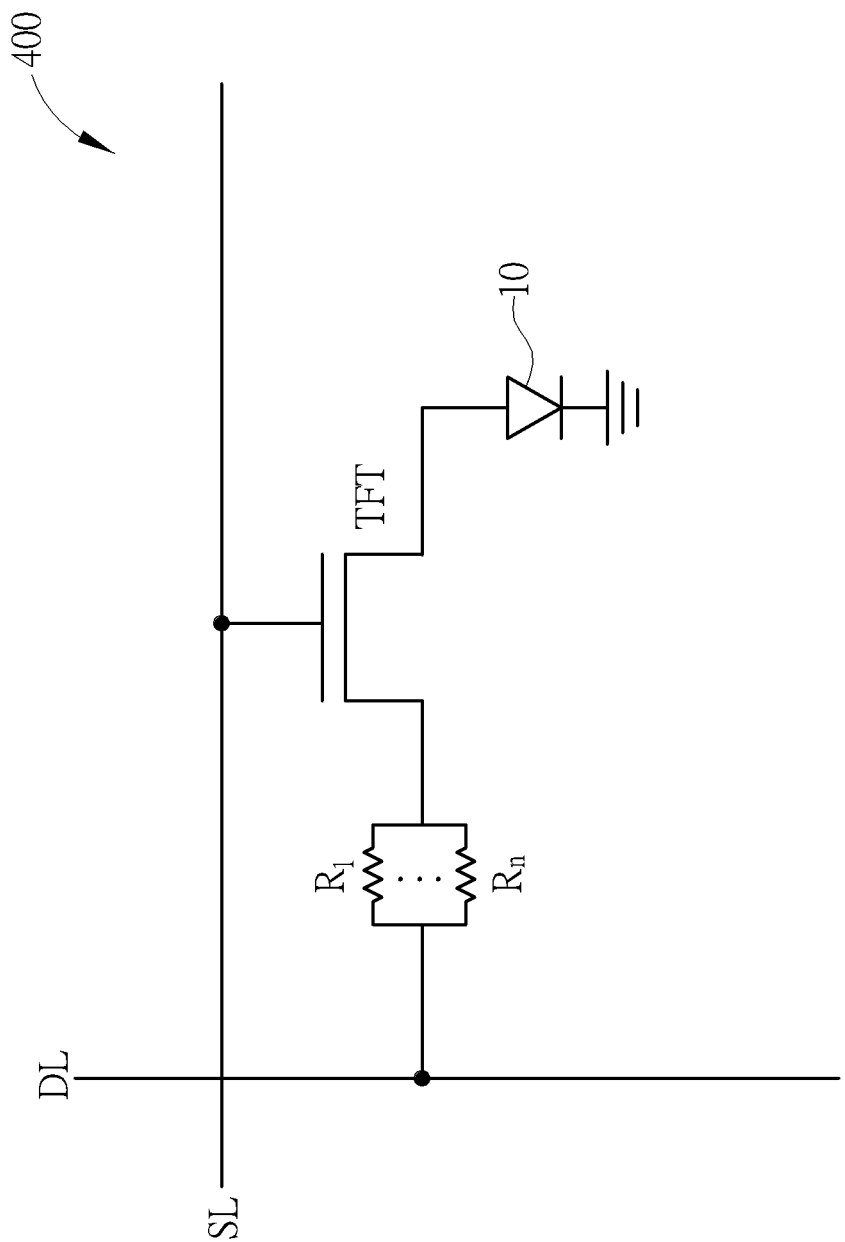

In the micro lighting device 400, pervious regions W1~Wn (n is a positive integer) may be formed on the source line 50 using laser cutting technique, as depicted in FIG. 4A. The corresponding equivalent resistors R1~Rn associated with the pervious regions W1~Wn are depicted in FIG. 4B. Since the driving current of the main luminescent device 10 encounters an impedance whose value is influenced by the equivalent resistors R1~Rn, the brightness of the main luminescent device 10 may be adjusted by varying the value of the driving current. The areas of the pervious regions W1~Wn are associated with the values of the equivalent resistors R1~Rn, and the amount of the pervious regions W1~Wn affects the overall brightness adjustment. With the above-mentioned adjustable impedance structure included in the source line 50, the present micro lighting device 400 is able to improve the undesirable mura effect.

Figure 5A:
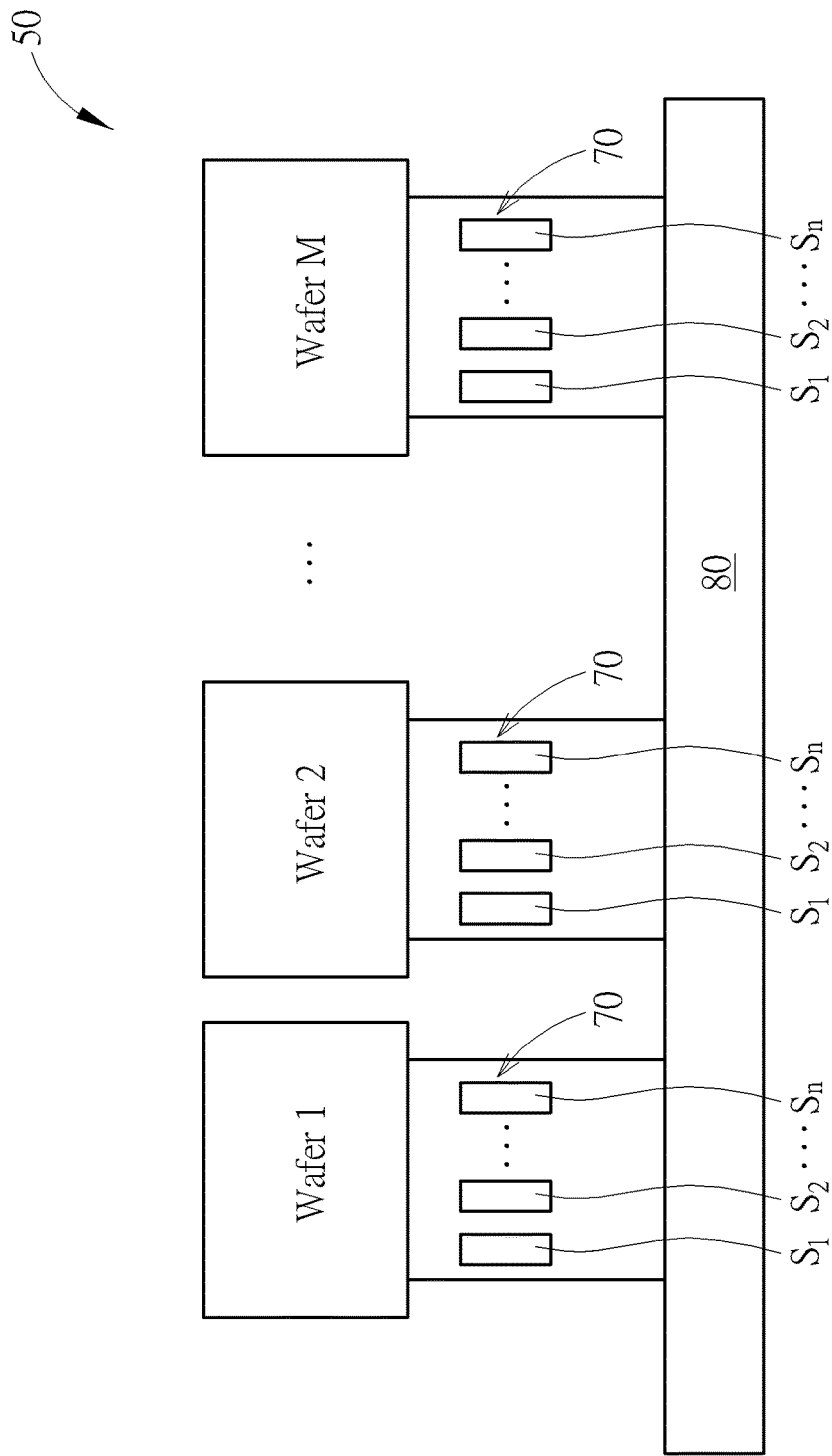
FIG. 5A is a diagram illustrating a micro lighting device according to another embodiment of the present invention.

FIG. 5A is a diagram illustrating a micro lighting device 500 according to an embodiment of the present invention. The micro lighting device 500 with a thin-film, miniaturized and array design each include a plurality of luminescent devices disposed on a plurality of wafers. Each wafer is coupled to a controller via a transmission line 70. Each transmission line 70 may be a ground line, a constant power line or a data line with an adjustable impedance structure. In other words, pervious regions S1~Sn (n is a positive integer) may be formed on each transmission line 70 using laser cutting technique in order to adjust the impedance of the signal transmission path between each wafer and the controller 80. Therefore, the brightness of each wafer may be adjusted to improve the undesirable mura effect.

Figure 5B:
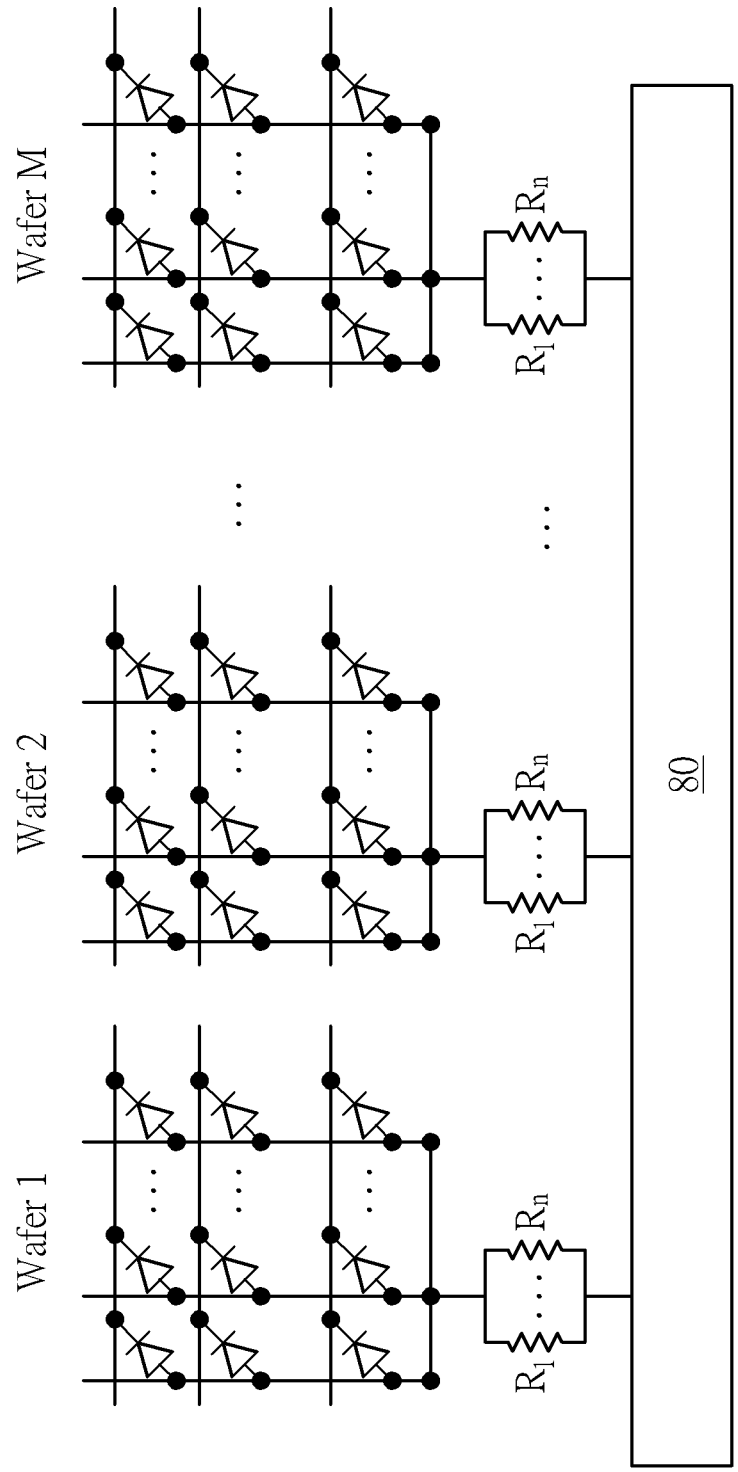
FIG. 5B is an equivalent circuit diagrams of a micro lighting device in operation according to another embodiment of the present invention.

FIG. 5B is an equivalent circuit diagrams of the micro lighting device 500 in operation according to an embodiment of the present invention. Since the driving current of each wafer encounters an impedance whose value is influenced by the equivalent resistors R1~Rn associated with the pervious regions S1~Sn, the brightness of the luminescent devices on the wafers may be adjusted by varying the value of the driving current. The areas of the pervious regions S1~Sn are associated with the values of the equivalent resistors R1~Rn, and the amount of the pervious regions S1~Sn affects the overall brightness adjustment. With the above-mentioned adjustable impedance structure included in the transmission line 70, the present micro lighting device 500 is able to improve the undesirable mura effect.

Figure 6A:
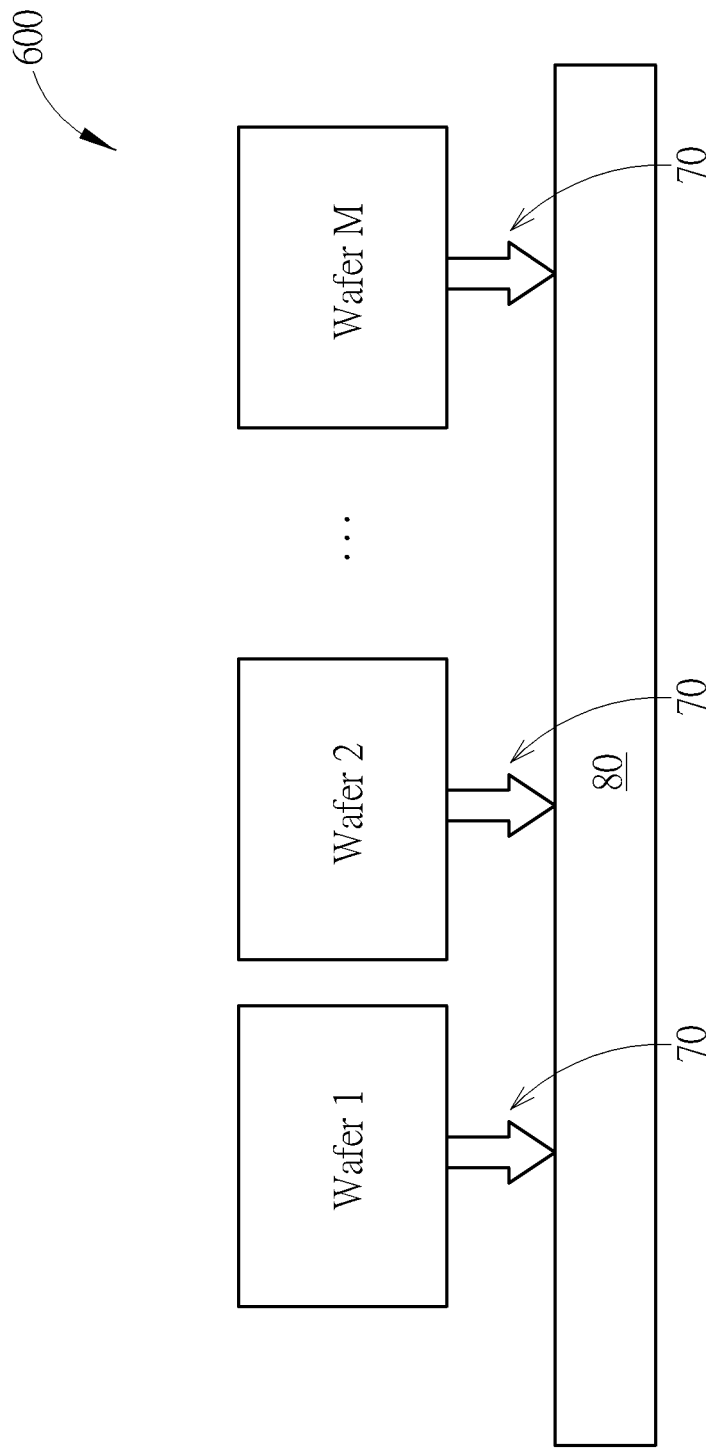
FIG. 6A is a diagram illustrating a micro lighting device according to another embodiment of the present invention.
Figure 6B:
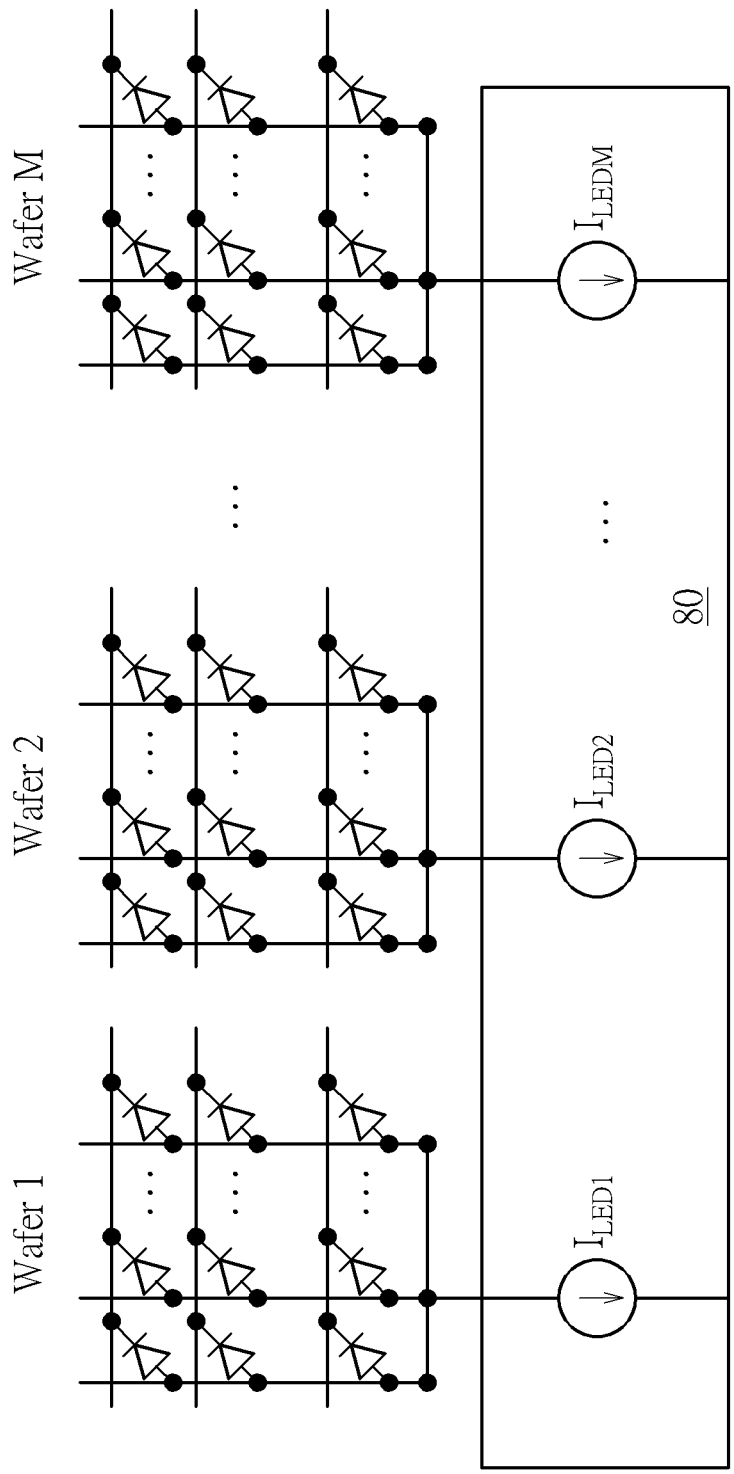
FIG. 6B is an equivalent circuit diagrams of a micro lighting device in operation according to another embodiment of the present invention.

FIG. 6A is a diagram illustrating a micro lighting device 600 according to an embodiment of the present invention. FIG. 6B is an equivalent circuit diagrams of the micro lighting device 600 in operation according to an embodiment of the present invention. The micro lighting device 600 with a thin-film, miniaturized and array design each include a plurality of luminescent devices disposed on a plurality of wafers. Each wafer is coupled to a controller 80 via a transmission line 70. The controller 80 is configured to detect the brightness of each wafer and adjust corresponding driving current $I_{LED1} \sim I_{LEDM}$ accordingly. Therefore, the brightness of each wafer may be adjusted to improve the undesirable mura effect.

In conclusion, the present invention provides a micro lighting device. In addition to good performances regarding power consumption, brightness, resolution, color saturation, reaction speed, life time and efficiency, the present micro lighting device can also improve the undesirable mura effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A micro lighting device, comprising: a source line; a drain line; a gate line; a ground line; a luminescent device comprising: a first electrode; and a second electrode coupled to the ground line; and a switching device comprising: a first end coupled to the source line; a second end coupled to the first electrode via the drain line; and a control end coupled to the gate line, wherein at least one of the source line, the drain line, the gate line and the ground line includes an adjustable impedance structure which provides a plurality of resistors connected in parallel to the first end of the switching device, a plurality of parallel resistors connected to the second end of the switching device, or a plurality of parallel resistors connected to the control end of the switching device for adjusting current flowing through the illuminating device.

2. The micro lighting device of claim 1, wherein:
the ground line includes one or multiple pervious regions located between the second electrode and a ground level.

3. The micro lighting device of claim 1, wherein:
the drain line includes one or multiple pervious regions located between the second end of the switching device and the first electrode.

4. The micro lighting device of claim 1, wherein:
the gate line includes one or multiple pervious regions located between a scan line and the control end of the switching device.

5. The micro lighting device of claim 1, wherein:
the source line includes one or multiple pervious regions located between a data line and the first end of the switching device.

6. The micro lighting device of claim 1, wherein the luminescent device is a micro light emitting diode (LED).

7. A micro lighting device, comprising: a plurality of wafers on which a plurality of luminescent devices are disposed; a controller configured to provide a driving signal for operating the plurality of luminescent devices; and a plurality of transmission lines arranged to couple the plurality of wafers to the controller for receiving the control signal, wherein at least one of the plurality of transmission lines includes an adjustable impedance structure which provides a plurality of parallel resistors connected to the controller for adjusting a value of the driving signal; each of plurality of parallel resistors are connected to respective node in which further connected to the controller.

8. The micro lighting device of claim 7, wherein the plurality of transmission lines includes a ground line, a constant power line or a data line.

9. The micro lighting device of claim 7, wherein the plurality of luminescent devices are micro LEDs.

* * * * *